US008245115B2

(12) United States Patent
Savin et al.

(10) Patent No.: US 8,245,115 B2
(45) Date of Patent: Aug. 14, 2012

(54) METHOD OF DECODING BY MESSAGE PASSING WITH SCHEDULING DEPENDING ON NEIGHBOURHOOD RELIABILITY

(75) Inventors: Valentin Savin, Grenoble (FR); Dimitri Ktenas, Fontaine (FR)

(73) Assignee: Commissariat a l'Energie Atomique, Paris (FR)

( * ) Notice: Subject to any disclaimer, the term of this patent is extended or adjusted under 35 U.S.C. 154(b) by 850 days.

(21) Appl. No.: 12/374,531

(22) PCT Filed: Jul. 25, 2007

(86) PCT No.: PCT/EP2007/057644
§ 371 (c)(1),
(2), (4) Date: Jan. 21, 2009

(87) PCT Pub. No.: WO2008/012318
PCT Pub. Date: Jan. 31, 2008

(65) Prior Publication Data
US 2009/0313525 A1 Dec. 17, 2009

(30) Foreign Application Priority Data
Jul. 27, 2006 (FR) ..................... 06 53148

(51) Int. Cl.
*H03M 13/00* (2006.01)
(52) U.S. Cl. ....................... 714/780; 714/752
(58) Field of Classification Search .................. 714/780, 714/781, 752, 755
See application file for complete search history.

(56) References Cited

U.S. PATENT DOCUMENTS

| 5,450,535 | A   | * | 9/1995  | North ........................... 345/440 |
|-----------|-----|---|---------|-------------------------------------------|
| 6,122,763 | A   | * | 9/2000  | Pyndiah et al. ............... 714/755    |
| 7,174,495 | B2  | * | 2/2007  | Boutillon et al. ............. 714/752    |
| 7,251,769 | B2  | * | 7/2007  | Ashikhmin et al. .......... 714/755       |
| 7,836,383 | B2  | * | 11/2010 | Efimov et al. ................. 714/780   |
| 2003/0138065 | A1 | * | 7/2003 | Mills et al. .................... 375/346 |
| 2004/0151259 | A1 | * | 8/2004 | Berens et al. ................. 375/340   |
| 2005/0076286 | A1 | * | 4/2005 | Zheng et al. .................. 714/755   |
| 2005/0138519 | A1 | * | 6/2005 | Boutillon et al. ............. 714/752    |
| 2005/0172204 | A1 | * | 8/2005 | Lin .............................. 714/755 |
| 2005/0204271 | A1 | * | 9/2005 | Sharon et al. ................. 714/801   |
| 2005/0204272 | A1 | * | 9/2005 | Yamagishi .................... 714/801    |
| 2005/0210366 | A1 | * | 9/2005 | Maehata ....................... 714/794    |
| 2005/0210367 | A1 | * | 9/2005 | Ashikhmin et al. .......... 714/801       |
| 2005/0216821 | A1 |   | 9/2005 | Harada                                    |

(Continued)

OTHER PUBLICATIONS

Kim et al; "Fast convergence decoding scheme to regular LDPC codes" IEEE Internat. Symposium on Intelligent Signal Processing and Communication Systems, ISPACS, Nov. 18, 2004 pp. 454-458.

(Continued)

*Primary Examiner* — Yolanda L Wilson
(74) *Attorney, Agent, or Firm* — Pearne & Gordon LLP

(57) ABSTRACT

The invention relates to an iterative method by message passing for decoding of an error correction code that can be displayed in a bipartite graph comprising a plurality of variable nodes and a plurality of check nodes. For each iteration in a plurality of decoding iterations of said method:
variable nodes or check nodes are classified (720) as a function of the corresponding degrees of reliability of decoding information available in the neighborhoods $(V_n^{(d)}, V_m^{(d)})$ of these nodes, a node with a high degree of reliability being classified before a node with a low degree of reliability;
each node thus classified (725) passes at least one message $(\alpha_{mn}, \beta_{mn})$ to an adjacent node, in the order defined by said classification.

The invention also relates to a computer program designed to implement said decoding method.

16 Claims, 11 Drawing Sheets

U.S. PATENT DOCUMENTS

| | | | |
|---|---|---|---|
| 2005/0229087 A1* | 10/2005 | Kim et al. | 714/800 |
| 2005/0268204 A1* | 12/2005 | Harada | 714/758 |
| 2005/0283707 A1* | 12/2005 | Sharon et al. | 714/758 |
| 2006/0195765 A1* | 8/2006 | Coffey | 714/760 |
| 2007/0101243 A1* | 5/2007 | Kim et al. | 714/790 |
| 2008/0065947 A1* | 3/2008 | Eroz et al. | 714/752 |
| 2008/0109708 A1* | 5/2008 | Kim et al. | 714/790 |
| 2008/0141096 A1* | 6/2008 | Zheng et al. | 714/755 |

OTHER PUBLICATIONS

Makay; "Good error-correcting codes based on very sparse matrices", IEEE Transactions on Information Theory, vol. 45, No. 2 1999, pp. 399-431.

Ryan; "An Introduction to LDPC Codes", Internet Citation, Aug. 19, 2003, URL: http://www.cseee.www.edu/wcrl/1dpc.htm, pp. 13-16.

Gallager; "Low—Density Parity-Check Codes", IEEE Trans. Information Theory, vol. It-8, pp. 21-28, 1962.

Berrou et al; "Near Optimum Error Correcting Coding and Decoding: turbo-codes" IEEE Trans. Information Theory, vol. 44, No. 10, pp. 1261-1271, 1996.

WIBERG; "Coding and Decoding on General Graphs", 1996.

Zhang et al; "Shuffled Iterative Decoding", IEEE Trans on Communication, vol. 53, No. 2, Feb. 2005 pp. 209-213.

International Search Report for PCT/EP2007/057644.

* cited by examiner (a)            (b)

METHOD OF DECODING BY MESSAGE PASSING WITH SCHEDULING DEPENDING ON NEIGHBOURHOOD RELIABILITY

TECHNICAL DOMAIN

This invention relates to decoding of error correction codes in the field of telecommunications or data recording. More precisely, the invention relates to an iterative method by message passing for decoding of error correction codes that can be displayed in a bipartite graph, such as LDPC (Low Density Parity Check) codes or turbocodes.

STATE OF PRIOR ART

Error correction codes that can be displayed by bipartite graph cover a wide variety of codes, particularly LDPC codes, initially described by R. Gallager in his article entitled "Low density parity check codes" published in IEEE Trans. Inform. Theory, vol. IT-8, pages 21-28, 1962, for which interesting properties have been rediscovered recently, and turbocodes introduced by C. Berrou et al. in his founding article "Near optimum error correcting coding and decoding: turbocodes" published in IEEE Trans. Inform. Theory, vol. 44, No. 10, pages 1261-1271, 1996.

A bipartite graph is a non-oriented graph in which all nodes are composed of two separate subsets such that two arbitrary nodes in a single sub-set are not connected together by an edge of the graph.

Some error correction codes can be displayed as a bipartite graph. The graph is partitioned into a first sub-set of nodes associated with symbols forming a code word and a second sub-set of nodes associated with the code constraints, typically parity checks. A bipartite graph associated with a group of constraints is also called a Tanner graph.

The symbols in the code word are usually Galois body elements $F_2 = \{0,1\}$, in other words bits, but they may more generally be elements of a body $F_{2^p}$ with an arbitrary 2 characteristic and consequently a $2^p$-ary alphabet. In the following, we will limit ourselves to the case p=1, in other words binary codes, with no loss of generality.

Additional representation codes by bipartite graph can be decoded using an iterative message passing (MP) or BP (Belief Propagation) decoding. A generic description of this decoding method is given in the thesis by N. Wiberg entitled "Codes and decoding on general graphs", 1996. MP type iterative decoding is actually a generalisation of algorithms well-known in the decoding field, namely the "forward-backward" algorithm used for turbocodes and the Gallager algorithm for LDPC codes.

For simplification reasons, the following contains a description of the principle of iterative decoding by message passing in the framework of an LDPC code. We will consider a linear code (K,N) in which K is the dimension of the code representing the number of information bits and N is the length of the code representing the number of coded bits. M=N−K is equal to the number of parity bits or equivalently, the number of parity constraints.

FIG. 1 shows the Tanner graph of a linear code (K,N). The left of the graph shows the nodes corresponding to the bits in the code, also called "variable" type nodes or simply "variables", and the right shows nodes corresponding to parity checks, also called "check" type nodes or more simply "checks". The incidence matrix of the graph corresponds to the parity matrix of the code that has dimension M×N. Thus, the bipartite graph comprises N "variable" type nodes and M "check" type nodes, a variable node n being connected to a check node m if and only if $h_{mn}=1$. For example, the graph in FIG. 1 corresponds to a code (10,5) with the following parity matrix:

$$H = \begin{pmatrix} 1 & 1 & 1 & 1 & 0 & 0 & 0 & 0 & 0 & 0 \\ 1 & 0 & 0 & 0 & 1 & 1 & 1 & 0 & 0 & 0 \\ 0 & 1 & 0 & 0 & 1 & 0 & 0 & 1 & 1 & 0 \\ 0 & 0 & 1 & 0 & 0 & 1 & 0 & 1 & 0 & 1 \\ 0 & 0 & 0 & 1 & 0 & 0 & 1 & 0 & 1 & 1 \end{pmatrix} \quad (1)$$

In general, remember that a linear code is defined by a generating matrix G for which the elements are binary values and a code word $x=(x_1, x_2, \ldots, x_N)$ is obtained from a word with information bits $a=(a_1, a_2, \ldots, a_K)$ by means of:

$$x = aG \quad (2)$$

Since all code words satisfy the parity checks, we obtain the relation:

$$H \cdot G^T = 0 \quad (3)$$

in which $G^T$ refers to the transpose in the matrix G.

The code word x is transmitted on a communication channel or is recorded on a data support. A noisy version of x, namely $Y=(y_1, y_2, \ldots, y_N)$, is recovered on reception or when reading the support. The decoding operation consists of finding x and therefore a starting from the observation y.

We will agree upon the following notations before describing the principle for iterative message passing decoding:

H(n) denotes all tests related to the variable n in the bipartite graph, in other words all nodes adjacent to node n;

H(m) is the set of variables connected to the check m in the bipartite graph, in other words all nodes adjacent to node m;

$\alpha_n$ represents the a priori information concerning the variable n in the bipartite graph, in other words the a priori information concerning the $n^{th}$ bit in the code word. This information takes account of the signal received and the characteristics of the transmission channel. It forms the input to the decoder and is usually provided by the demodulator in the form of soft values, namely in terms of likelihoods:

$$\alpha_n = (p_n^0, p_n^1) \quad (4)$$

where $p_n^a = Pr(x_n = a|y_n)$, $a \in \{0,1\}$,
or more conveniently, in the form of a logarithmic likelihood ratio (LLR):

$$\alpha_n = \ln\left(\frac{Pr(x_n = 0 | y_n)}{Pr(x_n = 1 | y_n)}\right) \quad (5)$$

Thus, for centred Gaussian white noise and BPSK modulation, the demodulator simply calculates:

$$\alpha_n = \frac{2}{\sigma^2} y_n \quad (6)$$

where $\sigma^2$ is the noise variance.

$\alpha_{mn}$ represents the message transmitted by the variable n to the check $m \in H(n)$. By reference to turbocodes, $\alpha_{mn}$ is also called extrinsic information;

$\beta_{nm}$ symmetrically represents the message transmitted by check m to the variable $n \in H(m)$. It is also qualified as extrinsic information;

$\hat{\alpha}_n$ represents the a posteriori information related to variable n: it takes account both of the a priori information $\alpha_n$ and the messages $\beta_{mn}$ received by the variable n from its adjacent checks during decoding;

$\bar{\alpha}_n$ is the hard value corresponding to the soft value $\hat{\alpha}_n$, in other words the decision made for bit $x_n$.

FIG. 2 shows the principle of iterative decoding by message passing.

In step 210, messages $\alpha_{mn}$ are initialised for each variable n and check m∈H(n) pair. Messages $\alpha_{mn}$ are usually initialised by the a priori information, in other words $\alpha_{mn}=\alpha_n$, ∀m∈H(n). The iteration counter Iter is also initialised to 0.

The initialisation step is followed by an iteration loop comprising the following steps:

In 220, the checks are initialised. More precisely, for each check m, messages $\beta_{mn}$ from check m to the corresponding variables n∈H(m) are calculated, namely:

$$\beta_{mn}=F_C(\{\alpha_{mn'}|n'\in H(m)-\{n\}\}) \quad (7)$$

in which $F_C$ is the check processing function. For an arbitrary given pair of nodes m,n∈H(m) the message $\beta_{mn}$ is calculated as a function of messages that the check m itself received from variables n'∈H(m)−{n}. Consequently, it is observed that no extrinsic information is forwarded from a variable node to itself. The check processing step is also called a horizontal step.

In 230, variables are processed symmetrically. More precisely, for each variable n, messages $\alpha_{mn}$ aimed at the corresponding checks m∈H(n) are calculated, namely:

$$\alpha_{mn}=F_V(\{\beta_{m'n}|m'\in H(n)-\{m\}\}) \quad (7')$$

in which the variable processing function is denoted $F_V$. For a given node pair n,m∈H(n), the message $\alpha_{mn}$ is calculated as a function of messages that the variable n itself received from the checks m'∈H(n)−{m}, such that no extrinsic information is forwarded from a node to itself, as described above. The variable processing step is also called the vertical step.

In 240, the a posteriori information $\hat{\alpha}_n$ is estimated from a priori information $\alpha_n$ and messages $\beta_{mn}$ received by the variable n from its adjacent check nodes m∈H(n), symbolically expressed as:

$$\hat{\alpha}_n=F_{AP}(\{\alpha_n\}\cup\{\beta_{mn}|m\in H(n)\}) \quad (8)$$

in which the a posteriori estimating function is denoted $F_{AP}$.

In 250, a decision on hard values $\bar{\alpha}_n$ is made from soft values $\hat{\alpha}_n$, namely:

$$\bar{\alpha}_n=F_D(\hat{\alpha}_n) \quad (8')$$

in which the decision function is denoted $F_D$. Typically, for a BPSK modulation, the decision is taken on the sign of the soft value, in other words $\bar{\alpha}_n=\text{sgn}(\hat{\alpha}_n)$. In the following, for convenience reasons, the value of a bit will be identified with its modulated value. Conventionally, bit "0" will be represented by the value "+1" and bit "1" will be represented by the value "−1".

In 260, it is checked if the $\bar{\alpha}=(\bar{\alpha}_1,\bar{\alpha}_2,\ldots,\bar{\alpha}_N)$ vector is a code word, in other words if it satisfies the parity checks. If so, the loop is terminated in step 265, the decoded word being $\bar{\alpha}$. If not, the number of iterations is incremented in step 267 and a comparison in step 270 determines if the number of iterations Iter made has reached a threshold value Iter_max. If not, iterative decoding is continued by looping back to step 220. By default, it is concluded that the decoding operation has failed and the loop is terminated in step 275.

The order of steps in the iteration loop may be different from the order shown in FIG. 2. In particular, the processing order of variables and checks can be inverted, and it is possible to begin by initialising messages $\beta_{mn}$: $\beta_{mn}=0$, ∀n∈{1,...N} and ∀m∈H(n).

According to the principle of iterative decoding shown in FIG. 2, all checks may be processed first followed by all variables, or as mentioned above, all variables may be processed first followed by all checks. This is referred to as "parallel scheduling" or "flooding scheduling". Other types of scheduling have been proposed in the literature; they may be classified in two categories:

serial type scheduling, a category that can include "serial scheduling", "shuffled-BP", "horizontal shuffled" or "vertical shuffled" scheduling. Serial type scheduling is equally applicable to checks and to variables. For application to checks, the decoding uses the following strategy:

firstly, a single check m is processed by calculating messages $\beta_{mn}$ to be sent to variables n∈H(m);

messages $\alpha_{m'n}$ from each variable n∈H(m) to be sent to checks m'∈H(n)−{m} are updated and transmitted. A posteriori information $\hat{\alpha}_n$ related to these variables is also updated;

the next check is processed, and the previous two steps are iterated until there are no more checks.

Similarly, variable by variable processing can be adopted instead of check by check processing. Depending on the case envisaged, the term "horizontal shuffled" or "vertical shuffled" scheduling will be used.

The two scheduling types mentioned above can also be hybridised in the form of "mixed" or "group-shuffled" scheduling. A description of the decoding strategy corresponding to mixed scheduling is given in the article by J. Zhang et al. entitled "Shuffled iterative decoding" published in IEEE Trans. on Comm., Vol. 53, No. 2, February 2005, pages 209-213. The strategy is based on a partition of nodes by groups, the processing being in parallel within a group and in series from one group to the next. More precisely, for a distribution of check groups:

a first group G consisting of checks $\{m_1, m_2, \ldots, m_g\}$ is processed by calculating messages $\beta_{m_in}$ to be sent to variables n∈H($m_i$), for i=1, ..., g;

messages $\alpha_{m'n}$ for each variable n∈H($m_i$), i=1, ..., g to be sent to the corresponding checks m'∈H(n)−{$m_i$} are updated and transmitted. A posteriori information $\hat{\alpha}_n$ for these variables is also updated;

the next check group is processed and the two previous steps are iterated until there are no more check groups.

Similarly, processing can be based on a partition by groups of variables, rather than a partition by groups of checks.

FIGS. 3, 4 and 5 diagrammatically show the message passing mechanism for parallel scheduling, serial scheduling and mixed scheduling respectively. It is assumed that checks are processed before variables are processed. FIG. 3 shows the first step in the processing of checks (a) and the first step in the processing of variables (b). FIGS. 4 and 5 show the first (a) and the second (c) steps in processing checks and the first step (b) and the second step in processing variables (d). In FIG. 5, all check nodes have been partitioned into two groups denoted $G_1$ and $G_2$ that are processed sequentially.

It will be noted that serial scheduling and parallel scheduling can be considered like special cases of mixed scheduling, the former corresponding to the case in which groups are reduced to singletons, the latter corresponding to the case in which a group comprises all check nodes (and variable nodes).

Two main principal iterative message passing decoding algorithms are known for LDPC codes, namely the SPA (Sum Product Algorithm) algorithm also called "log-BP", and the "Min-Sum" algorithm also called "based BP". A detailed description of these two algorithms is given in the article by W. E. Ryan entitled "An introduction to LDPC codes", published in the CRC Handbook for coding and signal processing for recording systems, available at the link www.csee.wv-u.edu/wcrl/ldpc.htm.

The only difference between the SPA and Min-Sum algorithms is in the check-processing step that will be described later. Other steps are identical, namely:

The variable processing step 230 consists of calculating the messages $\alpha_{mn}$ as follows:

$$\alpha_{mn} = \ln\left(\frac{Pr(x_n = 0 \mid y_n, B_{mn}^*, C_{mn})}{Pr(x_n = 1 \mid y_n, B_{mn}^*, C_{mn})}\right) \quad (10)$$

where $B_{mn}^*$ represents all messages $\beta_{m'n}$ received by the variable n from controls m'∈H(n)−{m} and $C_{mn}$ represents the event corresponding to a parity check verified for each of these checks. Provided that $y_n$ values are independent, it is shown that $\alpha_{mn}$ can be expressed in the form of LLR as follows:

$$\alpha_{mn} = \alpha_n + \sum_{m' \in H(n)-\{m\}} \beta_{m'n} \quad (11)$$

Step 240 to estimate the a posteriori information consists of calculating:

$$\hat{\alpha}_n = \ln\left(\frac{Pr(x_n = 0 \mid y_n, B_n, C_n)}{Pr(x_n = 1 \mid y_n, B_n, C_n)}\right) \quad (12)$$

where $B_n$ represents messages received by the variable n from all H(n) checks, and $C_n$ represents the event corresponding to a parity check verified for each of these checks. Based on the same assumption as above, it can be shown that $\hat{\alpha}_n$ can be expressed in LLR form by:

$$\hat{\alpha}_n = \alpha_n + \sum_{m \in H(n)} \beta_{mn} \quad (13)$$

According to (11) and (13), it is found that:

$$\alpha_{mn} = \hat{\alpha}_n - \beta_{mn} \quad (14)$$

Consequently, the variable processing step 230 may be placed at the end of the iteration, after the estimate of the a posteriori information. Expression (14) translates the fact that a node (m) does not return the extrinsic information (in this case $\beta_{mn}$) to itself.

The hard values decision-making step 250 is done simply by:

$$\bar{\alpha}_n = sgn(\hat{\alpha}_n) \quad (15)$$

where sgn(x)=1 if x is positive and sgn(x)=−1 otherwise.

Verification of parity checks on hard values in step 260 uses the calculation of parity checks:

$$c_m = \prod_{n \in H(m)} \bar{\alpha}_n, m = 1, \ldots, M \quad (16)$$

All parity checks are satisfied if and only if:

$$\sum_{m=1}^{M} c_m = M \quad (17)$$

The check-processing step 220 consists of calculating the following for the SPA algorithm:

$$\beta_{mn} = \ln\left(\frac{Pr(c_m = 1 \mid x_n = 0, A_{mn}^*)}{Pr(c_m = 1 \mid x_n = 1, A_{mn}^*)}\right) \quad (18)$$

where $c_m$=1 means a parity condition satisfied for the check m, and $A_{mn}^*$ represents all messages $\alpha_{mn'}$ received by the check m from variables n'∈H(m)−{n}. It is shown that $\beta_{mn}$ can be expressed by:

$$\beta_{mn} = \left(\prod_{n' \in H(m)-\{n\}} sgn(\alpha_{mn'})\right) \cdot \Phi\left(\sum_{n' \in H(m)-\{n\}} \Phi(|\alpha_{mn'}|)\right) \quad (19)$$

where $$\Phi(x) = \ln\left(\frac{e^x + 1}{e^x - 1}\right) = -\ln\left(\tanh\left(\frac{x}{2}\right)\right)$$

Processing of checks according to the Min-Sum algorithm corresponds to a simplification of the expression (19). Due to the fast decay of function $\Phi(x)$ and the fact that $\Phi(x)$ is equal to its reciprocal, i.e. $\Phi(\Phi(x))=x$, we can legitimately make the following approximation:

$$\beta_{mn} = \left(\prod_{n' \in H(m)-\{n\}} sgn(\alpha_{mn'})\right) \cdot \min_{n' \in H(m)-\{n\}} (|\alpha_{mn'}|) \quad (20)$$

The Min-Sum decoding algorithm is significantly simpler than the SPA decoding algorithm because it only performs additions, comparisons and sign changes. Furthermore, performances of the Min-Sum algorithm are independent of the estimate of the noise variance $\sigma^2$.

Although the performances of the SPA decoding algorithm are better than the performances of the Min-Sum algorithm, they can be severely degraded if the noise power is badly estimated.

The general purpose of this invention is to propose an iterative message passing type decoding algorithm to decode an error correction code that could be represented by a bipartite graph, with better performance in terms of error rate and convergence rate than algorithms of the same type known in the state of the art.

A first purpose of the invention is to propose an iterative message passing type decoding algorithm to decode an LDPC code with a significantly lower complexity than the SPA algorithm, while having comparable or even better error rate performances for a given signal to noise ratio, and also that does not require an estimate of the noise power.

Another particular purpose of this invention is to propose a message passing type decoding algorithm to decode LDPC codes with a higher convergence rate than SPA or Min-Sum algorithms.

PRESENTATION OF THE INVENTION

This invention is defined by an iterative method by message passing for decoding of an error correction code that can be displayed in a bipartite graph comprising a plurality of variable nodes and, a plurality of check nodes, said method being such that for each iteration in a plurality of decoding iterations:

variable nodes or check nodes are classified as a function of the corresponding degrees of reliability of decoding information available in the neighbourhoods of these nodes, a node with a high degree of reliability being classified before a node with a low degree of reliability;

each node thus classified passes at least one message to an adjacent node, in the order defined by said classification.

According to a first embodiment, for each node to be classified, said classification includes the calculation of a measurement of the reliability of the information present, sent or received by nodes at not more than a predetermined distance from this node in the bipartite graph, and sorting of values of the measurements thus obtained.

For each iteration of said plurality, the classified nodes are then processed sequentially in the order defined by said classification, and for each classified node, messages addressed to nodes adjacent to it are calculated, and for each said adjacent node, messages to nodes adjacent to said adjacent node are calculated.

According to a second embodiment, for each node to be classified, said classification includes the calculation of a measurement of the reliability of the information present, sent or received by nodes located at not more than a predetermined distance from this node in the bipartite graph. Nodes are grouped in intervals of values of said measurement.

If the reliability measurement uses integer values, then for each said integer value, indexes of nodes for which the reliability measurement is equal to this value are stored in a memory zone associated with it.

For each iteration of said plurality, node groups are processed sequentially in the order defined by said classification, and for each node group, messages to nodes adjacent to the nodes in the group are calculated, and for each of said adjacent nodes, messages to nodes themselves adjacent to said adjacent nodes are also calculated.

According to one variant, for each variable node in said bipartite graph, each iteration of said plurality also comprises a step to calculate a posteriori information as a function of the a priori information already present in this node, and messages received by this node from adjacent check nodes.

The a posteriori information calculation step may be followed by a decision step about the hard value of said variable.

The next step is to test if the hard values of variables thus obtained satisfy the parity checks associated with all check nodes in the graph, and if so, the word composed of said hard values is provided as a decoded word.

Advantageously, the classification is interrupted after a predetermined number of decoding iterations, the decoding method then continuing its decoding iterations in the absence of said classification of said variable nodes or said check nodes.

The classification is interrupted if the minimum of the absolute value of differences between the a posteriori values and a priori values of said variables is greater than a predetermined threshold value, the decoding method then continuing its decoding iterations in the absence of said classification of said variable nodes or said check nodes.

In a first application, said error correction code is a turbocode.

In a second application, said error correction code is an LDPC code (K,N) represented by a bipartite graph with N variable nodes and M=N−K check nodes.

In the latter case, the $\beta_{mn}$ message from a check node with index m∈{1, . . . , M} to a variable node with index n∈ {1, . . . , N} can be calculated as follows:

$$\beta_{mn} = \left(\prod_{n' \in H(m)-\{n\}} \mathrm{sgn}(\alpha_{mn'})\right) \cdot \Phi\left(\sum_{n' \in H(m)-\{n\}} \Phi(|\alpha_{mn'}|)\right)$$

where $\alpha_{mn'}$ denotes the message from the variable node with index n' to the check node with index m, H(m) represents all variable nodes adjacent to the check node with index m, sgn(x)=1 if x is positive and sgn(x)=−1 otherwise, and $$\Phi(x) = \ln\left(\frac{e^x + 1}{e^x - 1}\right).$$

Alternately, the message $\beta_{mn}$ from a check node with index m∈{1, . . . , M} to a variable node with index n∈{1, . . . , N} can be calculated as follows:

$$\beta_{mn} = \left(\prod_{n' \in H(m)-\{n\}} \mathrm{sgn}(\alpha_{mn'})\right) \cdot \min_{n' \in H(m)-\{n\}} (|\alpha_{mn'}|)$$

where $\alpha_{mn'}$ denotes the message from the variable node with index n' to the check node with index m, H(m) represents all variable nodes adjacent to the check node with index m, sgn(x)=1 if x is positive and sgn(x)=−1 otherwise.

According to one example embodiment, the classification applies to check nodes and said predetermined distance is equal to 2. The reliability measurement of a check node with index m is then calculated as follows:

$$\tilde{f}_2(m) = c + \sum_{n \in H(m)} \min(1, \mathrm{Card}\{m' \in H(n) - \{m\} \mid c_{m'} = -1\})$$

where H(m) denotes the set of variable nodes adjacent to the check node with index m, H(n) represents the set of check nodes adjacent to the variable node with index n, Card(.) denotes the cardinal of a set, where c=0 if $c_m$=+1 and c=$\delta_{max}$+1 if $c_m$=−1 where $\delta_{max}$ is the maximum degree of check nodes in the bipartite graph, and where $c_m$=+1/$c_m$=−1 mean that the parity check is/is not satisfied respectively for the check node with index m.

Finally, the invention relates to a computer program comprising software means adapted to implementing steps in the decoding method defined above when it is executed by a computer.

DETAILED DESCRIPTION OF PARTICULAR EMBODIMENTS

Figure 1:
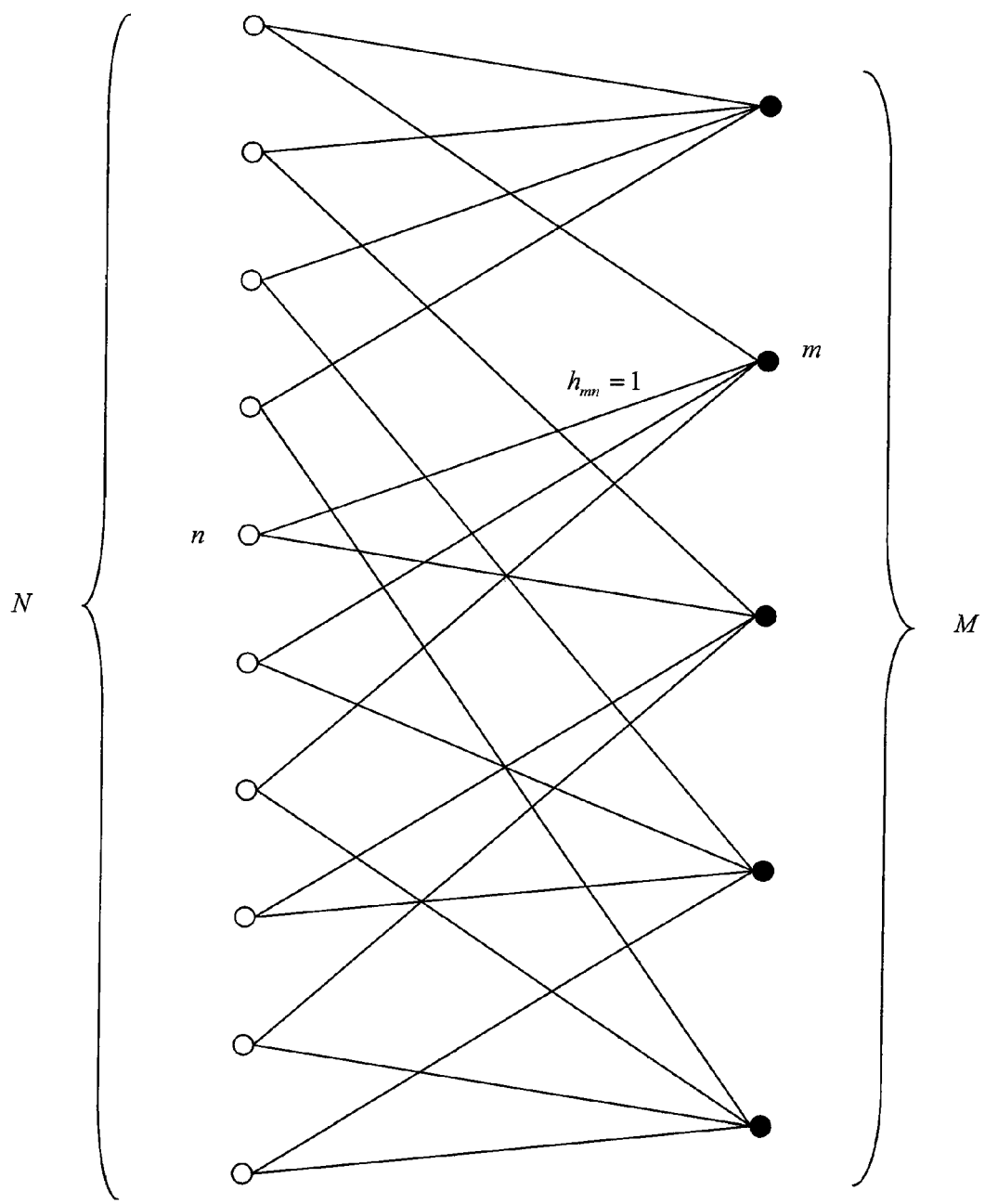
FIG. 1 shows an example of a Tanner graph for a (K,N) code.

We will once again consider an error correction code that could be represented by a bipartite graph with N variables and M checks.

The length of the shortest path through the graph connecting two nodes $v, \mu$ on the graph is called the distance and its length is denoted $D(v,\mu)$, expressed as a number of edges. Considering the definition of a bipartite graph, it is deduced that the distance between two nodes with the same type is an even number and the distance between two nodes of different types is an odd number.

The order d neighbourhood of an arbitrary node v of a graph $\Gamma$ is defined as the set $V_v^{(d)}$ of nodes located at a distance less than or equal to d from v, namely:

$$V_v^{(d)} = \{\mu \in \Gamma | D(\mu,v) \leq d\} \quad (21)$$

Thus, the order 0 neighbourhood of a node consists of the node itself, the order 1 neighbourhood is the combination of the order 0 neighbourhood with all nodes adjacent to this node, the order 2 neighbourhood is the combination of the order 1 neighbourhood with all nodes adjacent to nodes in the order 1 neighbourhood, and so on. For a bipartite graph composed of n variables and m checks, the order 0 to 2 neighbourhoods of these nodes are given by:

$$V_n^{(0)} = \{n\}; \quad V_n^{(1)} = \{n\} \cup H(n); \quad V_n^{(2)} = H(n) \bigcup_{m \in H(n)} H(m) \quad (22)$$

$$V_m^{(0)} = \{m\}; \quad V_m^{(1)} = \{m\} \cup H(m); \quad V_m^{(2)} = H(m) \bigcup_{n \in H(m)} H(n) \quad (23)$$

It will be noted that the singleton $\{n\}$ (or $\{m\}$) does not appear in the expression of $V_n^{(2)}$ (or $V_m^{(2)}$) because it is already included in the second term of the combination, taking account of the symmetry of the adjacency relation.

In general, the neighbourhoods of a node v of a bipartite graph can be obtained by means of the recurrence relation:

$$V_v^{(d+1)} = \bigcup_{\mu \in V_v^{(d)}} H(\mu) \quad (24)$$

Figure 6A:
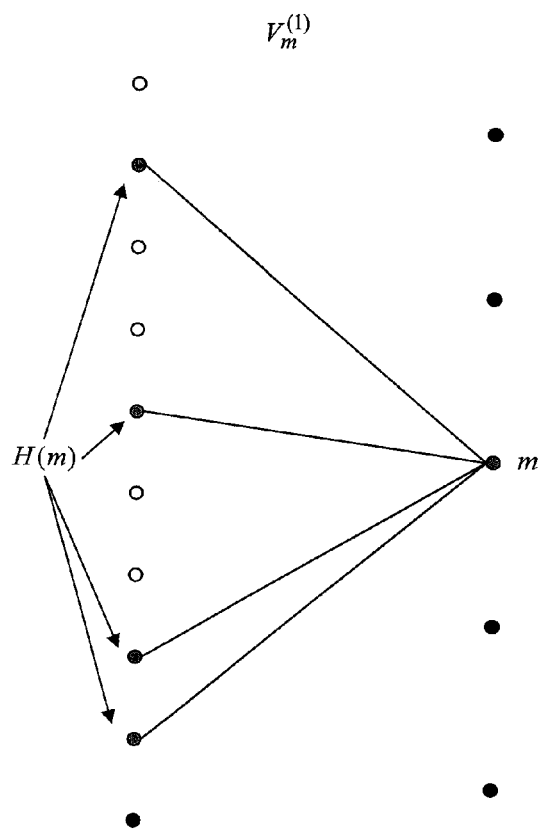
FIGS. 6A and 6B show the order 1 and order 2 neighbourhoods respectively, of a node.
Figure 6B:
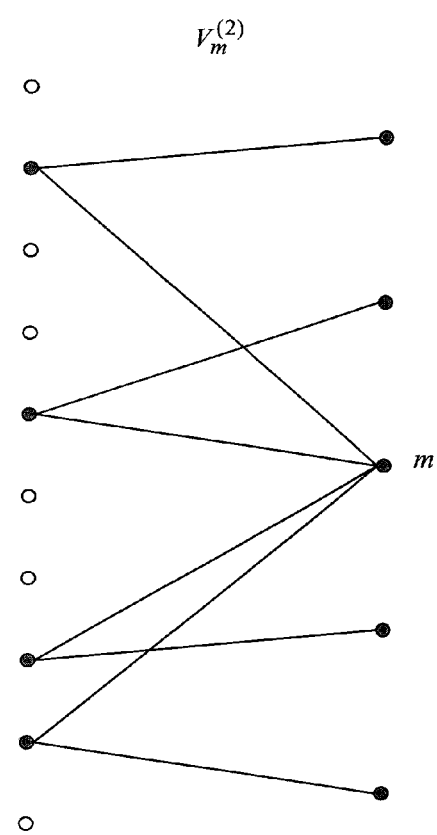

FIGS. 6A and 6B show the order 1 and order 2 neighbourhoods of a check node m on the graph in FIG. 1, to explain the neighbourhood concept. Nodes belonging to said neighbourhoods are shown in grey.

In the remainder of this description, the term order d reliability measurement of a node v of $\Gamma$ will be used to refer to a variable $f_d(V)$ dependent on the available decoding information in the neighbourhood $V_v^{(d)}$, in other words information present, sent or received by nodes belonging to said neighbourhood indicating the local degree of reliability of the decoding operation. We will qualify the measurement as "positive" when $f_d(V)$ increases as the degree of reliability increases and "negative" otherwise.

The decoding information available at a check node m comprises firstly the value $c_m$ indicating whether or not the parity check is verified, and secondly $\beta_{mn}$ messages transmitted to adjacent variable nodes $n \in H(m)$. The value $c_m$ and messages $\beta_{mn}$ carry reliability information about decoding.

The information available at a variable node n comprises the a priori information $\alpha_n$, the a posteriori information $\hat{\alpha}_n$, extrinsic information messages $\alpha_{mn}$ to be sent to adjacent check nodes $m \in H(n)$ and hard values $\overline{\alpha}_n$.

The above-mentioned information, except for hard values, carries reliability information about decoding.

In general, considering soft values $\beta_{mn}$, $\alpha_{mn}$, $\alpha_n$, $\hat{\alpha}_n$, expressed in LLR form, decoding will be considered more reliable when their absolute values are higher.

The following contains a few illustrative and non-limitative examples of reliability measurements for orders 0 to 2:

order 0 reliability measurements:

The neighbourhood is then reduced to the node itself. We can choose the following function to measure the zero order reliability of a variable node n:

$$f_0(n) = |\hat{\alpha}_n| \quad (25)$$

which indicates the degree of confidence in the hard value $\overline{\alpha}_n$.

For a check node m we could simply choose the following function:

$$\hat{f}_0(m) = c_m \quad (26)$$

It can be understood that if the parity check were satisfied ($c_m = 1$), decoding would be more reliable than if it were not satisfied.

order 1 reliability measurements:

The processing for a variable node and a check node is different once again. For a variable node, one of the following functions can be chosen as an order 1 reliability measurement:

$$f_1(n) = \text{Card}\{m \in H(n) | c_m = +1\} \quad (27)$$

$$f_1'(n) = \text{Card}\{m \in H(n) | c_m = -1\} \quad (27')$$

$$f_1(n) = \text{Card}\{m \in H(n) | c_m = +1\} - \text{Card}\{m \in H(n) | c_m = -1\} \quad (28)$$

$$f_1(n) = \text{Card}\{m \in H(n) | c_n = -1\} - \text{Card}\{m \in H(n) | c_m = +1\} \quad (28')$$

$$f_1(n) = \min_{m \in H(n)} |\beta_{mn}| \quad (29)$$

Expression (27) represents the number of check nodes m connected to the variable node n for which the parity check is verified.

Expression (28) takes account of the irregularity of the code (in other words the possibility that variable nodes have different degrees) and produces the summary of verified and non-verified parity checks.

Expressions (27') and (28') are negative measurements corresponding to positive measurements (27) and (28).

The reliability measurement expressed in (29) is conservative because it is based on a reduction of the reliability information received from the adjacent check nodes.

For a check node m, we could choose one of the following functions for an order 1 reliability measurement:

$$\tilde{f}_1(m) = \min_{n \in H(m)} (|\hat{\alpha}_n|) \quad (30)$$

$$\tilde{f}_1(m) = \min_{n \in H(m)} (|\alpha_{mn}|) \quad (31)$$

$$\tilde{f}_1(m) = \left(c_m, \min_{n \in H(m)} (|\hat{\alpha}_n|)\right) \quad (32)$$

Expression (30) indicates the minimum of the reliabilities (a posteriori information) of variables to which check m is connected.

Expression (31) represents a similar criterion but applies to extrinsic information. It will be noted that it is the twin of the expression (29).

Expression (32) represents the Cartesian product of two items of information and consequently takes account of them jointly, the first applies to the verification of the parity check and the second to a posteriori information as in (30).

order 2 reliability measurements:

The following function can be chosen for a variable node n:

$$f_2(n) = \text{Card}\left\{m \in H(n) \mid c_m = -1 \text{ and } \hat{\alpha}_n = \min_{n' \in H(m)} \hat{\alpha}_{n'}\right\} \quad (33)$$

Expression (33) represents a negative decoding reliability measurement; it indicates the number of checks related to variable n for which the parity condition is not satisfied and such that the variable n is the least reliable among all variables adjacent to these checks. In fact, the measurement (33) could be considered as the composition of measurements (27') and (30).

One of the following functions could be chosen for a check node m:

$$\tilde{f}_2(m) = \text{Card}\{m' \in V_m^{(2)} - \{m\} \mid c_{m'} = 1\} \quad (34)$$
$$= \sum_{n \in H(m)} \text{Card}\{m' \in H(n) - \{m\} \mid c_{m'} = -1\}$$

$$\tilde{f}_2(m) = \sum_{n \in H(m)} \min(1, \text{Card}\{m' \in H(n) - \{m\} \mid c_{m'} = -1\}) \quad (35)$$

$$\tilde{f}_2(m) = c + \sum_{n \in H(m)} \min(1, \text{Card}\{m' \in H(n) - \{m\} \mid c_{m'} = -1\}) \quad (36)$$

where c=0 if $c_m$=+1 and c=$\delta_{max}$+1 if $c_m$=−1, where $\delta_{max}$ is the maximum degree of check nodes, in other words $$\delta_{max} = \max_m (\text{Card}(H(m))).$$

Expression (34) gives the number of parity checks not satisfied in the order 2 neighbourhood of m, excluding m itself. It represents a negative measurement of the decoding reliability. It will be noted that the second equality of the expression (34) is only satisfied if there are no cycles with length 4 in the neighbourhood concerned. In practice, codes are used for which Tanner graphs have the longest possible cycles, such that equality is usually verified.

Expression (35) indicates the number of variables adjacent to m, connected to at least one unsatisfied check, excluding m itself. Consequently, it represents a negative measurement of the decoding reliability. Since terms under the sum sign are equal to 0 or 1, the value of the measurement is between 0 and $\delta_{max}$.

The expression (35) makes no distinction depending on whether or not the parity check is verified for node m. In order to take account of this information, a bias c was introduced into expression (36), with a value that depends on the verification of check m.

For the bias values mentioned above (c=0,$\delta_{max}$+1), the reliability measurement is equal to values between 0 and $\delta_{max}$ for a verified check and between $\delta_{max}$+1 and 2$\delta_{max}$+1 for a verified check. Note that this is a negative reliability measurement in the sense defined above, i.e. the lower the value of $\tilde{f}_2(m)$, the more reliable the value of the check m. Thus, the reliability degree of a verified check is always greater than the degree of reliability of a non-verified check, regardless of the value of (35).

It will be noted that some of the functions defined above are integer values, and particularly functions (34) to (36). Therefore, they are particularly suitable for a microprocessor implementation.

Importantly, some of the functions defined above, and particularly functions (34) to (36), only use hard values $c_m$. Since $$c_m = \prod_{n \in H(m)} \bar{\alpha}_n,$$

it can be seen that the value of the noise power ($\sigma^2$) does not appear in the calculation of these functions.

The basic concept of the invention is to classify nodes of the graph as a function of their reliability and to do the decoding by message passing using a serial or mixed type scheme, beginning with the most reliable node or group of nodes. This considerably improves the decoding performances, both in terms of convergence rate and bit error rate (BER).

It will be understood that messages transmitted by the most reliable nodes are the most capable of efficiently contributing to decoding adjacent nodes. There is thus fast propagation of reliability from one iteration to the next, and from node to node, and correlated to this, a significant increase in the absolute value of extrinsic information as the iterations proceed.

Figure 7:
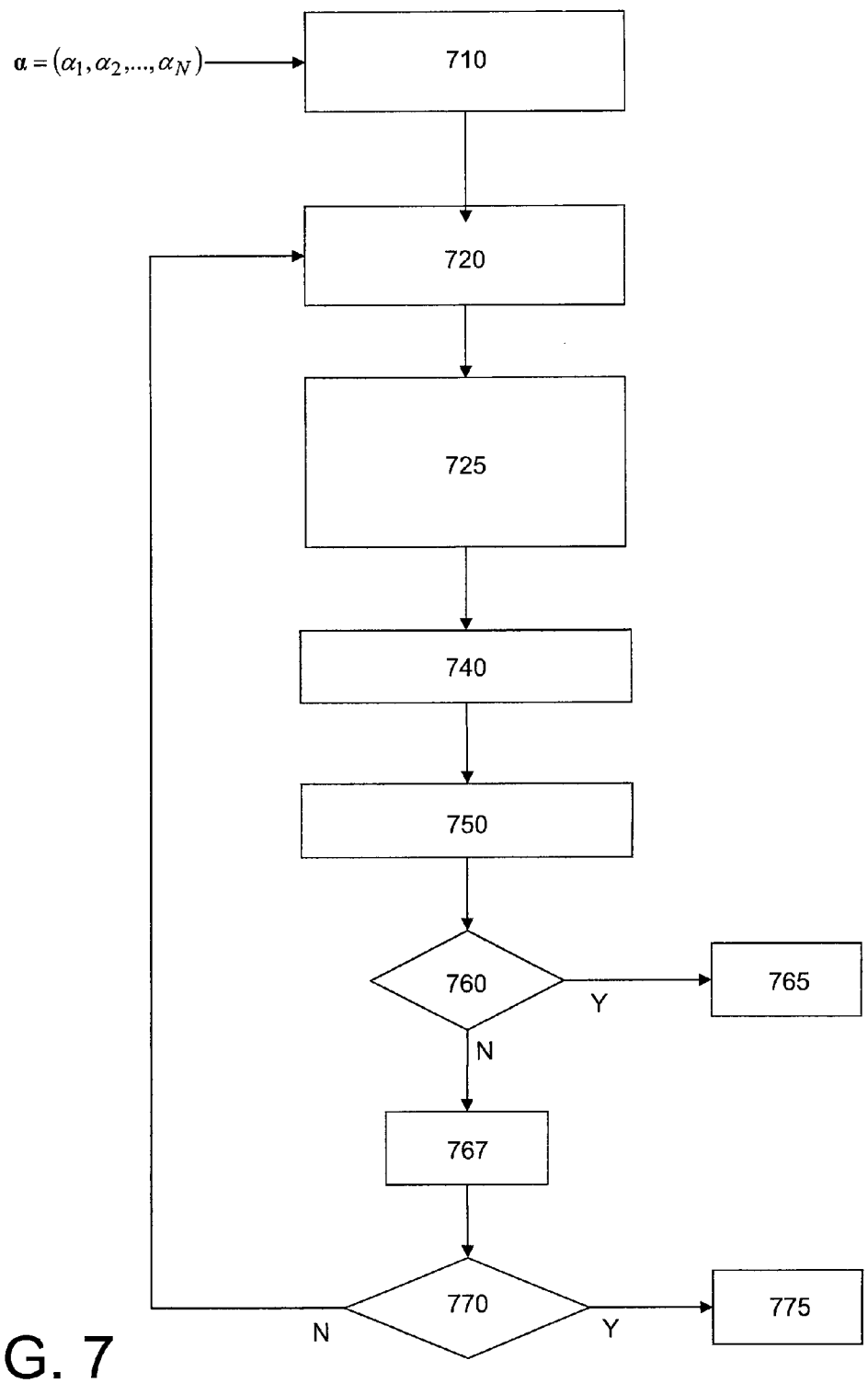
FIG. 7 shows the principle of iterative decoding by message passing according to the invention.

FIG. 7 diagrammatically shows the decoding principle according to the invention. After an initialisation phase 710 that will be detailed later, an iteration loop starts. Check nodes or variable nodes of the graph are classified in 720, depending on their degree of reliability. We will assume herein that check nodes are classified, since the classification of variable nodes leads to symmetric steps.

Figure 2:
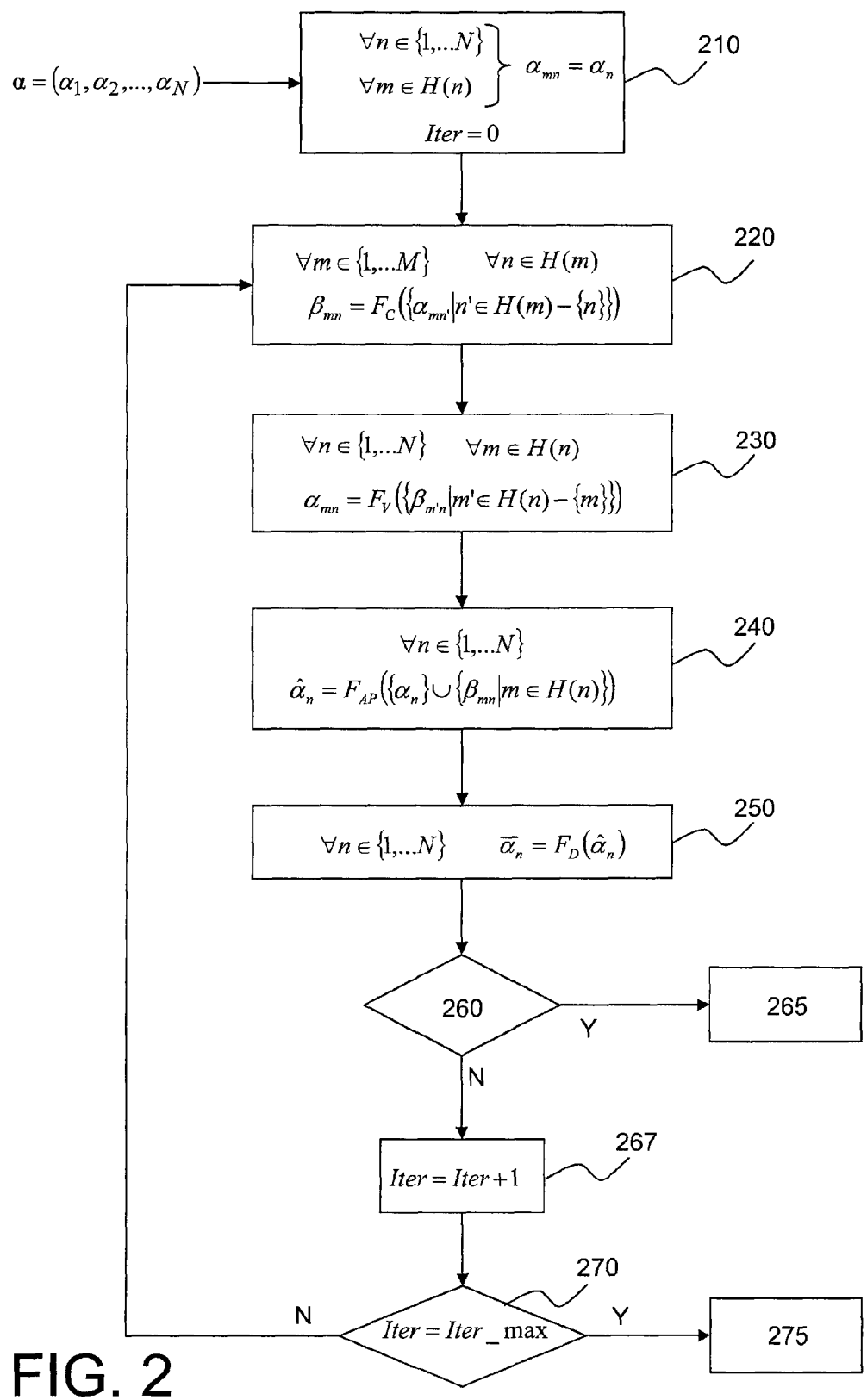
FIG. 2 diagrammatically shows the principle of iterative message passing decoding known according to the state of the art.
Figure 3:
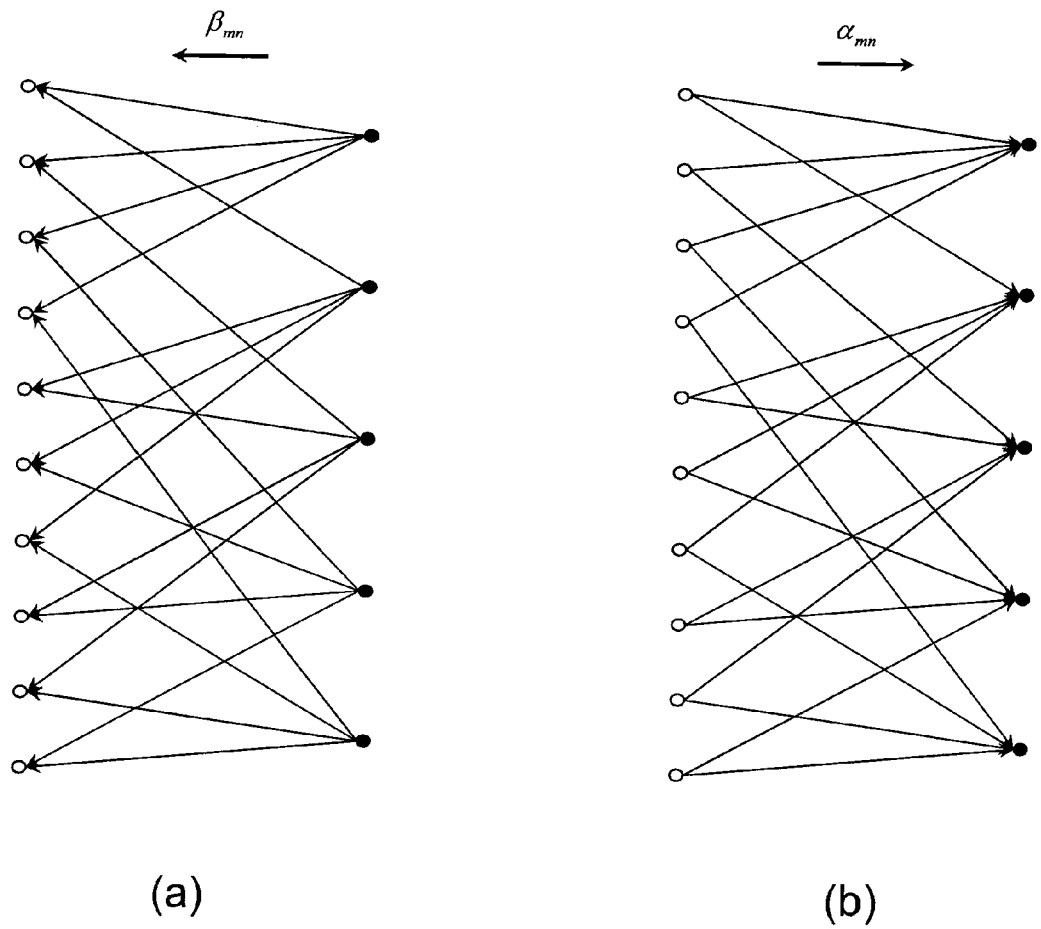
FIG. 3 shows the first iterations of iterative decoding by message passing according to a parallel type scheduling.
Figure 4:
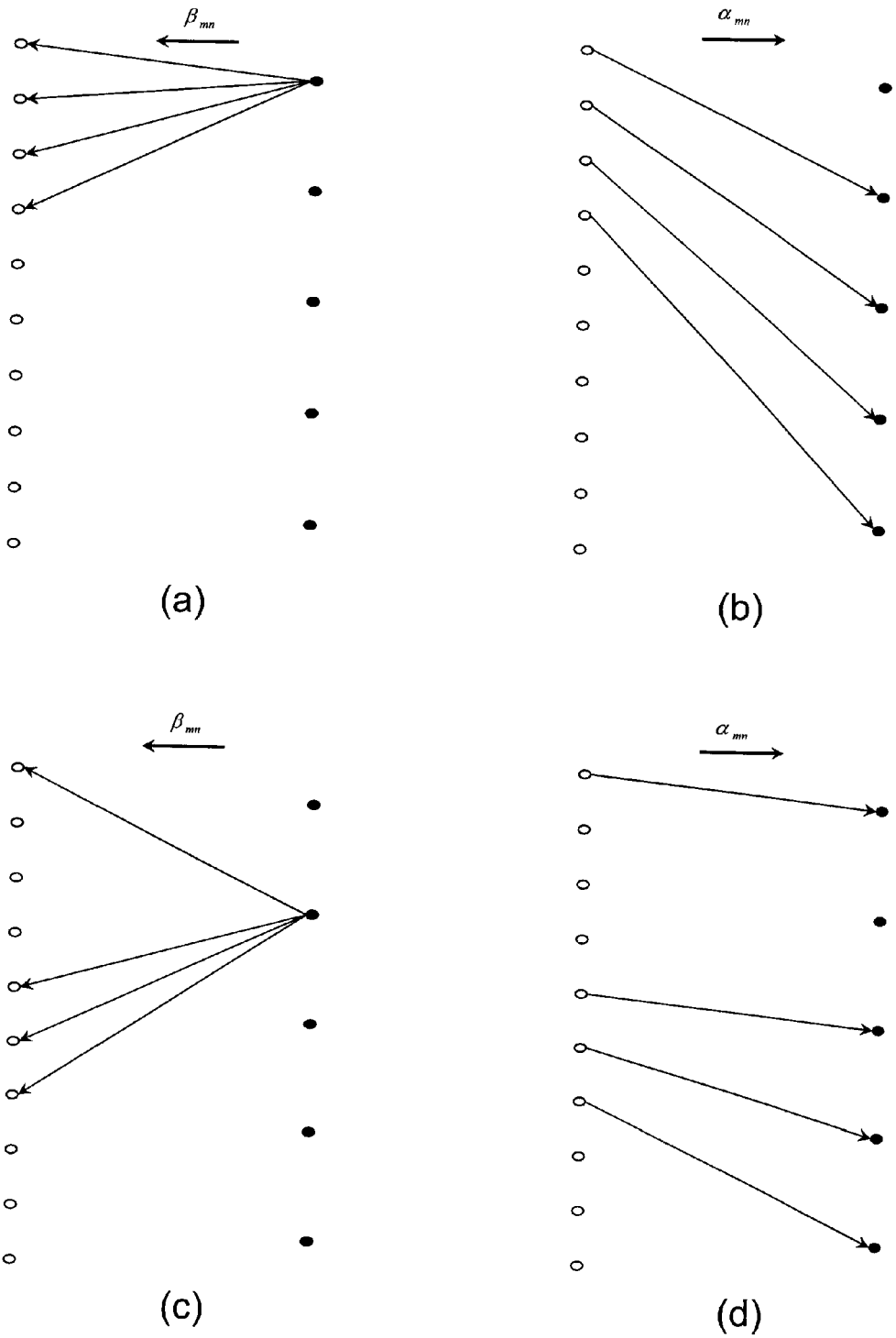
FIG. 4 shows the first iterations of iterative decoding by message passing according to a serial type scheduling.
Figure 5:
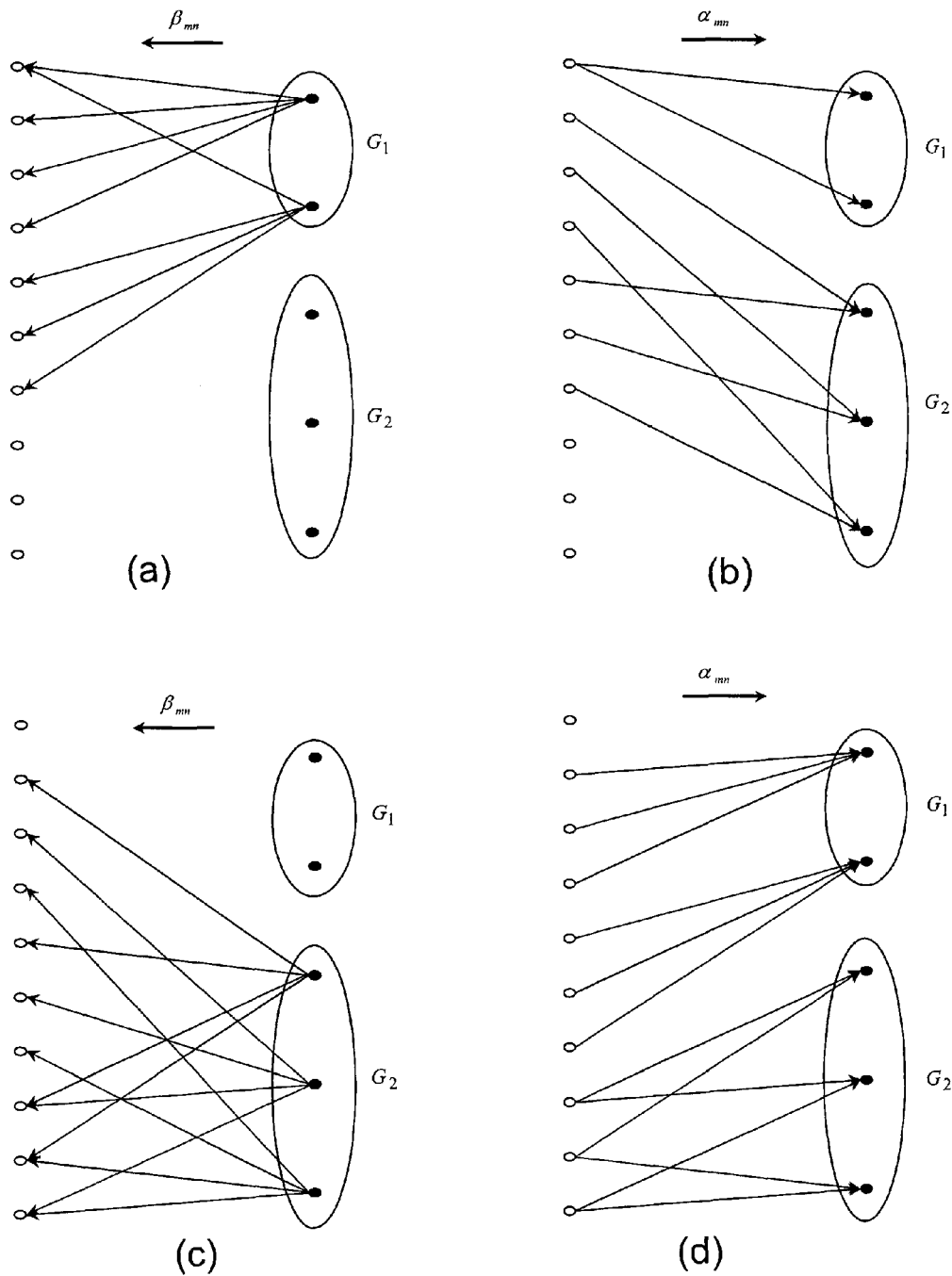
FIG. 5 shows the first iterations of iterative decoding by message passing according to a mixed type scheduling.

Serial processing or mixed processing is done in step 730. For serial type processing, check nodes are processed sequentially, and variable nodes adjacent to each check node are also processed sequentially, beginning with the most reliable check node and continuing in decreasing degrees of reliability. For mixed type processing, check nodes will have been classified in reliability groups, the first group being composed of the most reliable nodes, the second group being composed of less reliable nodes, etc. Parallel processing is done on variable nodes and check nodes in the first group, then parallel processing is done on variable nodes and check nodes in the next group, and so on until there are no more groups. Steps 740, 750, 760, 765, 767, 770, 775 are identical to steps 240, 250, 260, 265, 267, 270, 275 in FIG. 2 respectively and therefore will not be described in detail any further.

Figure 8:
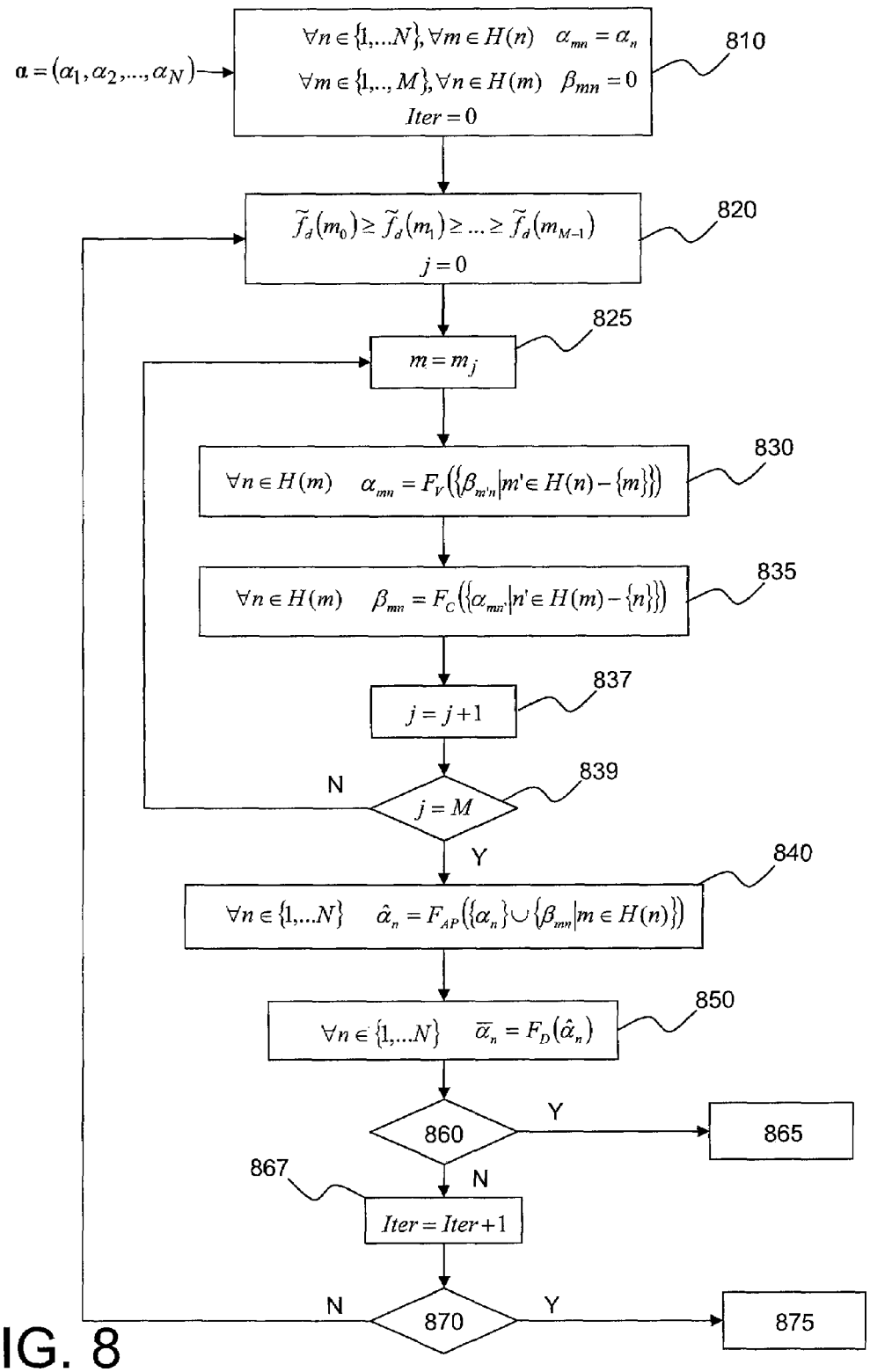
FIG. 8 shows an iterative method for decoding by message passing according to a first embodiment of the invention.

FIG. 8 shows more details of an embodiment of the invention using a serial scheduling.

Messages $\alpha_{mn}$ and $\alpha_{mn}$ are initialised in step 810. For example, for each variable n and check m∈H(n) pair, $\alpha_{mn}$ is initialised as $\alpha_{mn}=\alpha_n$. Similarly, for each check m and variable n∈H(m) pair, $\beta_{mn}$ is initialised as $\beta_{mn}=0$.

The checks are then sorted by decreasing degree of reliability in 820, using the reliability measurements $\tilde{f}_d(m)$. In other words, for a positive measurement checks are sorted such that $\tilde{f}_d(m_0) \geq \tilde{f}_d(m_1) \geq \ldots \geq \tilde{f}_d(m_{M-1})$, and for a negative measurement they are sorted in the reverse order. The lexicographic order relation or the inverse lexicographic order relation is used for a Cartesian product measurement (for example see (32)), depending on whether the measurement is positive or negative. We also initialise a counter of check nodes j=0.

The current check $m=m_j$ is then selected in 825 and the variables n∈H(m) are processed in 830, in other words $\alpha_{mn}=F_V(\{\beta_{m'n}|m'\in H(n)-\{m\}\})$ is calculated.

Step 835 then does current check processing m, in other words $\beta_{mn}=F_C(\{\alpha_{mn'}|n'\in H(m)-\{n\}\})$ is calculated for n∈H (m).

According to one variant embodiment, steps 830 and 935 are inverted.

The check node counter is incremented in step 837 and a test is made in step 839 to find if they have all been processed. If not, the processing loops back to step 825, otherwise it continues with steps 840 to 860 representing the calculation of a posteriori information, the decision on hard values and the verification of parity checks respectively. Steps 840, 850, 860, 865, 867, 870, 875 are identical to steps 240, 250, 260, 265, 267, 270, 275 respectively in FIG. 2.

According to one alternative embodiment, variables instead of checks are sorted. The internal loop 825 to 839 then applies to one variable at a time, and in the same way as before, the current variable may be processed before or after processing of the checks adjacent to it.

Figure 9:
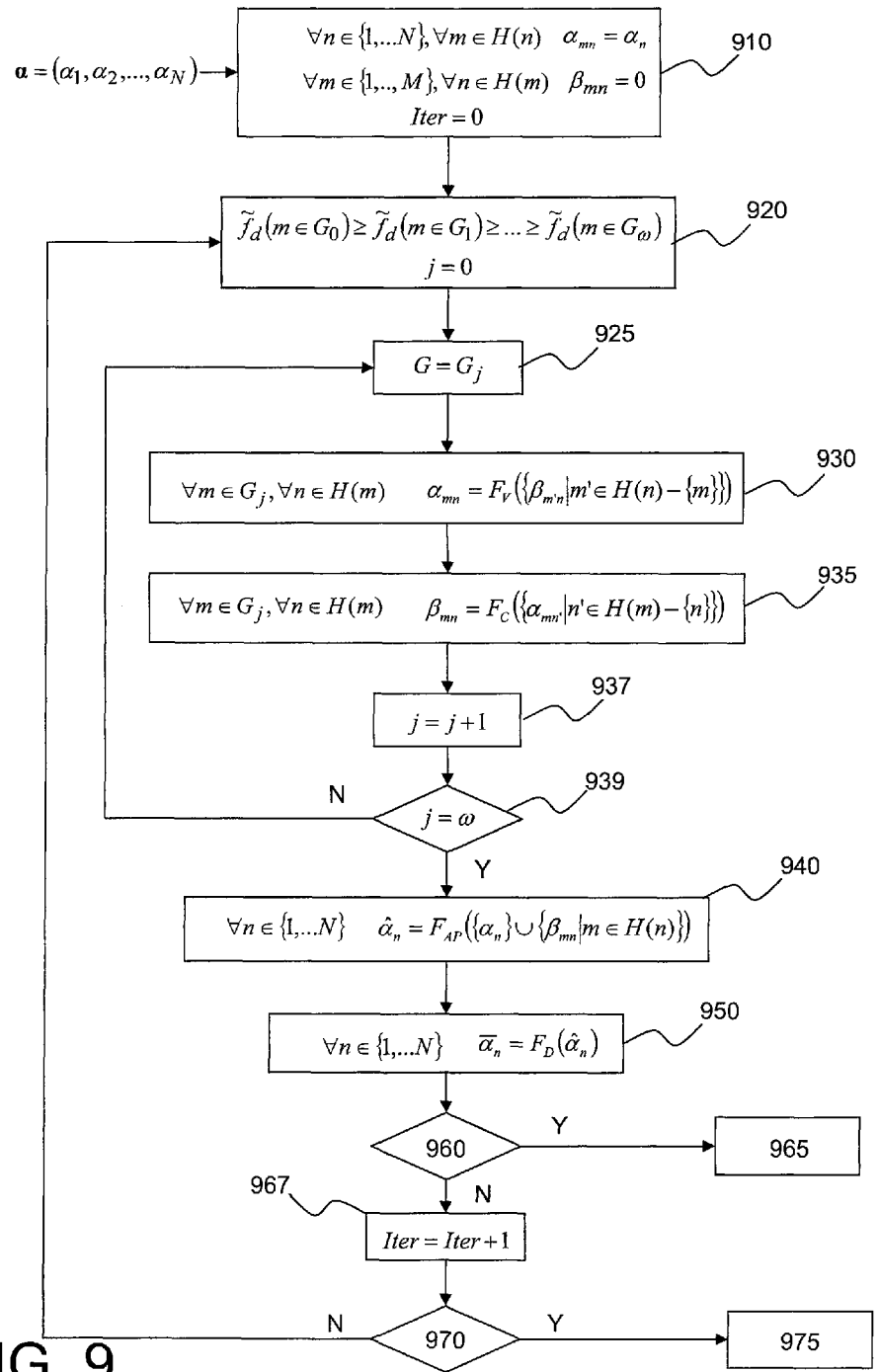
FIG. 9 shows an iterative method for decoding by message passing according to a second embodiment of the invention.

FIG. 9 shows one embodiment of the invention, using mixed scheduling.

In step 910, messages $\alpha_{mn}$ and $\beta_{mn}$ are initialised as in step 810 in FIG. 8.

In step 920, all check nodes or variable nodes are partitioned into groups, each corresponding to a different reliability class. For example, a reliability class is defined by means of an interval of values of a reliability measurement. This embodiment is particularly advantageous when the measurement uses integer values. We can then allocate a range to an integer value or to a plurality of contiguous integer values and store the indexes of the nodes in a table as a function of their corresponding classes. We will subsequently denote the different reliability classes $\phi_0, \phi_1, \ldots, \phi_\omega$, where $\phi_0$ is the class with the highest degree of reliability and $\phi_\omega$ is the class with the lowest degree of reliability, and $G_0, G_1, \ldots, G_\omega$ are the corresponding node groups. It is assumed in the following that the partition was made on check nodes.

We also initialise the counter of reliability classes to j=0.

In step 925, we select the group of nodes corresponding to the current reliability class $\phi_j$, namely $G_j$.

In step 930, variables n∈H(m), ∀m∈$G_j$, are processed in parallel, in other words messages $\alpha_{mn}=F_V(\{\beta_{m'n}|m'\in H(n)-\{m\}\})$, ∀m∈$G_j$, ∀n∈H(m) are calculated.

In step 935, checks m∈$G_j$ are processed in parallel, in other words messages $\beta_{mn}=F_C(\{\alpha_{mn'}|n'\in H(m)-\{n\}\})$, ∀m∈$G_j$, ∀n∈H(m) are calculated.

According to one variant embodiment, steps 930 and 935 are inverted.

In step 937, the class counter is incremented and it is tested in step 939 to determine if they have all been processed. If not, the processing loops back to step 925, otherwise it continues with steps 940 to 960 representing the calculation of a posteriori information, the decision on hard values and the verification of parity checks respectively. Steps 940, 950, 960, 965, 967, 970, 975 are identical to steps 240, 250, 260, 265, 267, 270, 275 respectively in FIG. 2.

Figure 10:
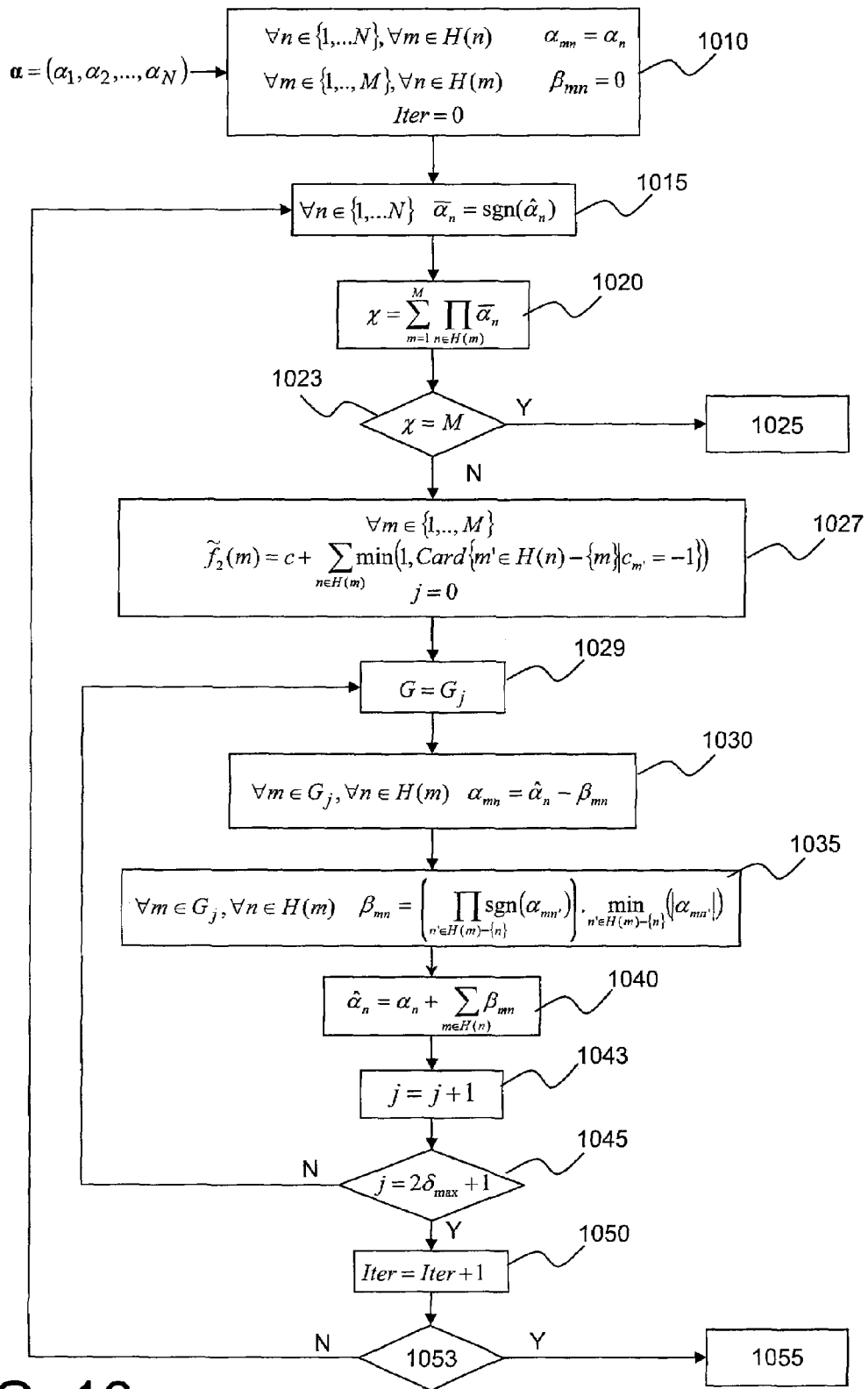
FIG. 10 shows an example application of the decoding method according to the invention to decode an LDPC code.

FIG. 10 shows a particular application of the invention to decoding of an LDPC code by means of mixed scheduling, based on a reliability measurement with integer values. In this case, we chose the negative measurement on check nodes defined in (36).

In step 1010, soft a posteriori values $\hat{\alpha}_n$ are initialised by the corresponding observations $\hat{\alpha}_n=\alpha_n$ and $\beta_{mn}$ messages are initialised by 0.

We also initialise the iteration counter to 0.

In step 1015, a decision is made about hard values, namely $\hat{a}_n=\text{sgn}(\hat{\alpha}_n)$.

Step 1020 calculates the value $$\chi = \sum_{m=1}^M c_m$$

in which $c_m$ values are parity checks $$c_m = \prod_{n \in H(m)} \overline{a}_n,$$

m=1, . . . , M

Step 1023 tests if χ=M, in other words if all parity checks are verified. If so, the decoding algorithm is exited in step 1025 by providing the code word. Otherwise, the processing continued in step 1027 by calculating reliability measurements of check nodes using the measurement (36). Remember that this measurement is equal to integer values among 0, 1, . . . , $2\delta_{max}+1$ where $\delta_{max}$ is the maximum degree of check nodes. In this case, we assign a reliability class by integer value, namely $\phi_0, \phi_1, \ldots, \phi_\omega$ where $\omega=2\delta_{max}+1$ and where class $\phi_j$ corresponds to the measurement value j∈{0, 1, . . . , $2\delta_{max}+1$}.

In step 1029, the group of nodes corresponding to the current reliability class $\phi_j$, namely $G_j$ is chosen.

In step 1030, the processing of variables n∈H(m), ∀m∈$G_j$ is done in parallel, in other words messages $\alpha_{mn}=\hat{\alpha}_n-\beta_{mn}$ ∀m∈$G_j$ are calculated.

Checks m∈$G_j$ are processed in parallel in step 1035, in other words messages to be sent to variables n∈H(m), ∀m∈$G_j$ are calculated, specifically $$\beta_{mn} = \left(\prod_{n' \in H(m)-\{n\}} \text{sgn}(\alpha_{mn'})\right) \cdot \Phi\left(\sum_{n' \in H(m)-\{n\}} \Phi(|\alpha_{mn'}|)\right)$$

for SPA processing and $$\beta_{mn} = \left(\prod_{n' \in H(m)-\{n\}} \text{sgn}(\alpha_{mn'})\right) \cdot \min_{n' \in H(m)-\{n\}} (|\alpha_{mn'}|)$$

for simplified Min-Sum type processing as indicated in this case in the figure. A posteriori information is then calculated in step 1040 using $$\hat{\alpha}_n = \alpha_n + \sum_{m \in H(n)} \beta_{mn}.$$

It will be noted that part of the checks m∈H(n) used in the summation possibly do not form part of the group $G_j$ and therefore the messages $\beta_{mn}$ that originate from these checks were not recalculated in step 1035. Furthermore, since the variable n is adjacent to several checks m∈H(n), the calculation of $\hat{\alpha}_n$ will be made several times as the checks of H(n) are processed. In order to prevent the sum in step 1040 from being calculated several times, and some messages $\beta_{mn}$ that have not changed from being recalculated each time, steps 1035 and 1040 can advantageously be replaced by a single step including the following operations:

∀m∈$G_j$, ∀n∈H(m)

subtract the old message, namely: $\hat{\alpha}_n = \hat{\alpha}_n - \beta_{mn}$
calculate the new message, namely:

$$\beta_{mn} = \left(\prod_{n' \in H(m)-\{n\}} \text{sgn}(\alpha_{mn'})\right) \cdot \min_{n' \in H(m)-\{n\}}(|\alpha_{mn'}|)$$

update the a posteriori information by adding the new message:

$\hat{\alpha}_n = \hat{\alpha}_n + \beta_{mn}$

In this way, the a posteriori information $\hat{\alpha}_n$ is updated as the new messages sent by checks m∈H(n) to the variable n are calculated. This can significantly reduce the number of operations carried out for the a posteriori information calculation.

The next step 1043 is to increment the reliability class counter and then to test if all classes have been processed in step 1045. If not, step 1029 is repeated to process the next reliability class. If so, the iteration counter is incremented in step 1050. Step 1053 tests if the stop criterion is satisfied, in other words if the maximum number of iterations has been reached. If so, the loop is terminated in step 1055, concluding that decoding has failed. Otherwise, processing loops back to step 1015 for a new iteration.

We can see in FIG. 10 that decision step on hard values and the step for verification of the parity check precede the reliability calculation and node processing steps. This is due to the fact that the reliability measurement used here (expression (36)) calls upon hard decisions $c_m$ and consequently requires that they are calculated in advance.

The algorithm shown in FIG. 10 is only slightly more complex than SPA or Min-Sum algorithms according to the state of the art. On the other hand, scheduling by neighbourhood reliability accelerates convergence to reach a lower bit error rate (BER) for the same signal to noise ratio (SNR). Alternately, for the same set value error rate, the decoding method according to the invention can use codes with a lower coding gain.

Figure 11:
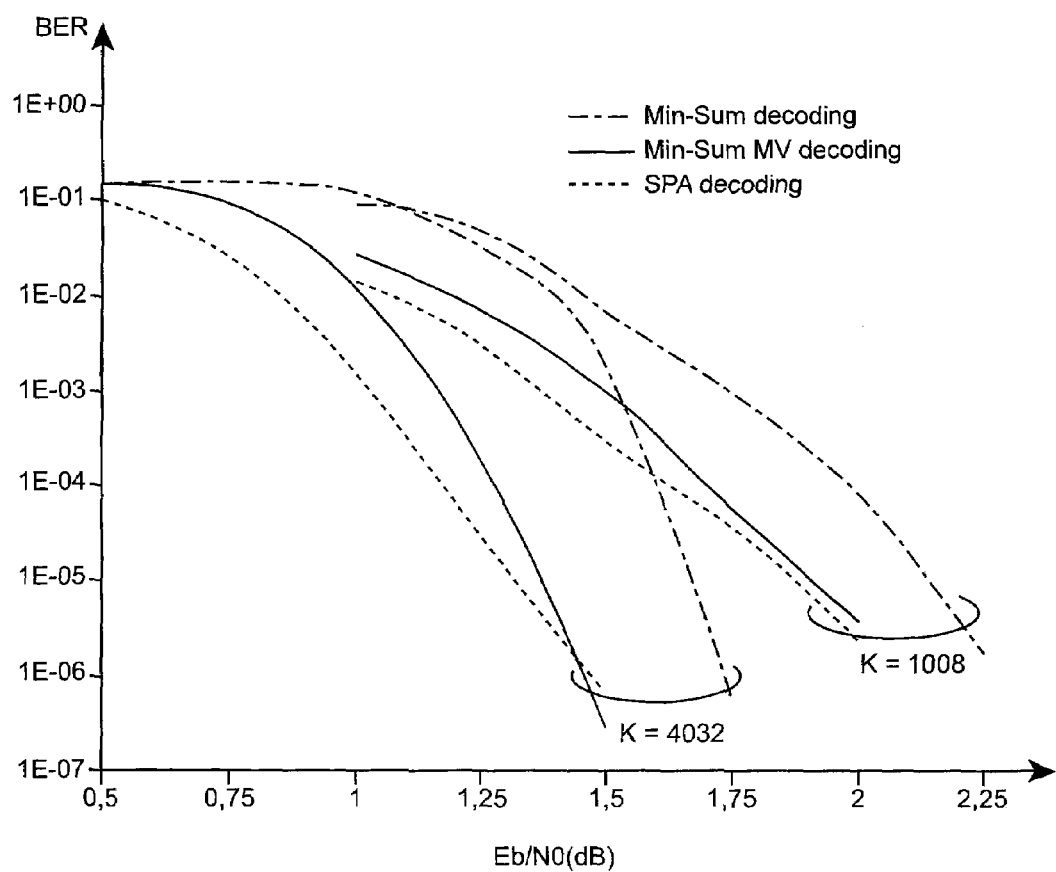
FIG. 11 shows the error rate obtained by the decoding method according to the invention, in comparison with other methods according to the state of the art, for a particular LDPC code.

FIG. 11 compares performances, in terms of the bit error rate (BER), of conventional Min-Sum and SPA algorithms, with the Min-Sum algorithm using scheduling by neighbourhood reliability, denoted Min-Sum-FV, for a large range of signal to noise ratios. The codes used are irregular LDPC codes [1008,2016] and [4032,8064], and therefore with ½ efficiency. The number of iterations is equal to 200 for the three algorithms.

It is observed that the Min-Sum-FV algorithm according to the invention surpasses the conventional SPA algorithm, although its complexity is significantly lower.

In the decoding method according to the invention shown in FIGS. 7 to 10, it is assumed that scheduling by neighbourhood reliability is used throughout the decoding duration. According to one variant, this scheduling can be applied only during the first iterations, to remove noise from observations, then to change over to conventional processing. The change over criterion may be a number of iterations Iter$_f$ or advantageously, it may be based on a comparison of the absolute value of extrinsic information with a reference threshold. For example, as soon as in iterative decoding:

$$\min_{n=1,\ldots,N} |\hat{\alpha}_n - \alpha_n| > T_f \qquad (37)$$

where $T_f$ represents a minimum reliability threshold, it would be possible to return to a Min-Sum or conventional SPA processing. This variant prevents sorting or classification of nodes as soon as decoded values are sufficiently reliable and convergence is assured.

This invention is applicable to decoding of error correction codes that could be represented by bipartite graph, and particularly LDPC codes or turbocodes. It can be used in the field of data recording or telecommunications, and particularly for telecommunication systems that already use LDPC codes, for example telecommunication systems complying with IEEE 802.3a (Ethernet 10 Gbits/s), DVB-S2 (satellite video broadcasting), IEEE 802.16 (WiMAX) standards, or that could use these codes, for example systems satisfying the IEEE 802.11 (WLAN) and IEEE 802.20 (Mobile Broadband Wireless Access) standards.

The invention claimed is:

1. A method for decoding an error correction code that can be displayed in a bipartite graph comprising a plurality of variable nodes and a plurality of check nodes, said method comprising for each iteration in a plurality of decoding iterations:

variable nodes or check nodes are classified as a function of the corresponding degrees of reliability of decoding information available in the neighbourhoods ($V_n^{(d)}$, $V_m^{(d)}$) of these nodes, a node with a high degree of reliability being classified before a node with a low degree of reliability;

each node thus classified passes at least one message ($\alpha_{mn}$, $\beta_{mn}$) to an adjacent node, in the order defined by said classification.

2. The method according to claim 1, characterised in that for each node to be classified, said classification includes the calculation of a measurement of the reliability ($f_d$ n, $f_d$ m) of the information present, sent or received by nodes at not more than a predetermined distance (d) from this node in the bipartite graph, and sorting of values of the measurements thus obtained.

3. The method according to claim 2, characterised in that, for each iteration of said plurality, the classified nodes are processed sequentially in the order defined by said classification, and for each classified node, messages addressed to nodes adjacent to it are calculated, and for each said adjacent node, messages to nodes adjacent to said adjacent node are calculated.

4. The method according to claim 1, characterised in that for each node to be classified, said classification includes the calculation of a measurement of the reliability ($f_d$ n, $f_d$ m) of the information present, sent or received by nodes located at not more than a predetermined distance (d) from this node in the bipartite graph, and in that nodes are grouped in intervals of values of said measurement.

5. The method according to claim 4, characterised in that the reliability measurement uses integer values and in that for each said integer value, indexes of nodes for which the reliability measurement is equal to this value are stored in a memory zone associated with it.

6. The method according to claim 4 or 5, characterised in that, for each iteration of said plurality, node groups are processed sequentially in the order defined by said classification, and in that, for each node group ($G_j$), messages to nodes adjacent to the nodes in the group are calculated and, for each of said adjacent nodes, messages to nodes themselves adjacent to said adjacent nodes are also calculated.

7. The method according to claim 1, characterised in that for each variable node in said bipartite graph, each iteration of said plurality also comprises a step to calculate an a posteriori information ($\alpha_n$) as a function of an a priori information ($\alpha_n$) already present in this node, and messages ($\beta_{mn}$) received by this node from adjacent check nodes.

8. The method according to claim 7, characterised in that the a posteriori information calculation step is followed by a decision step about the hard value ($\alpha_n$) of said variable.

9. The method according to claim 8, characterised in that the next step tests if the hard values of variables thus obtained satisfy the parity checks associated with all check nodes in the graph and if so, the word composed of said hard values is provided as the decoded word.

10. The method according to claim 7, characterised in that the classification is interrupted if the minimum of the absolute value of differences between the a posteriori values and a priori values of said variables is greater than a predetermined threshold value ($T_f$), the decoding method then continuing its decoding iterations in the absence of said classification of said variable nodes or said check nodes.

11. The method according to claim 1, characterised in that the classification is interrupted after a predetermined number of decoding iterations ($Iter_f$), the decoding method then continuing its decoding iterations in the absence of said classification of said variable nodes or said check nodes.

12. The method according to claim 1, characterised in that said error correction code is a turbocode.

13. The method according to claim 1, characterised in that said error correction code is an LDPC code (K, N) represented by a bipartite graph with N variable nodes and M=N−K check nodes.

14. The method according to claim 13, characterised in that the $\beta_{mn}$ message from a check node with index m∈1, ..., M to a variable node with index n∈1, ..., N is calculated as follows:

$$\beta_{mn} = \left( \prod_{n' \in H(m) - \{n\}} \text{sgn}(\alpha_{mn'}) \right) \cdot \Phi \left( \sum_{n' \in H(m) - \{n\}} \Phi(|\alpha_{mn'}|) \right),$$

where $\alpha_{mn'}$ denotes the message from the variable node with index n' to the check node with index m, H(m) represents all variable nodes adjacent to the check node with index m, sgn(x)=1 if x is positive and sgn(x)=−1 otherwise, and $$\Phi(x) = \ln\left( \frac{e^x + 1}{e^x - 1} \right).$$

15. The method according to claim 13, characterised in that the message $\beta_{mn}$ from a check node with index m∈1, ..., M to a variable node with index n∈1, ..., N is calculated as follows:

$$\beta_{mn} = \left( \prod_{n' \in H(m) - \{n\}} \text{sgn}(\alpha_{mn'}) \right) \cdot \min_{n' \in H(m) - \{n\}} (|\alpha_{mn'}|)$$

where $\alpha_{mn'}$ denotes the message from the variable node with index n' to the check node with index m, H(m) represents all variable nodes adjacent to the check node with index m, sgn(x)=1 if x is positive and sgn(x)=−1 otherwise.

16. The method according to claims 5 or 15, characterised in that the classification applies to check nodes, and in that said predetermined distance is equal to 2 and in that the reliability measurement of a check node with index m is then calculated as follows:

$$\tilde{f}_2(m) = c + \sum_{n \in H(m)} \min(1, \text{Card}\{m' \in H(n) - \{m\} \mid c_{m'} = -1\})$$

where H(m) denotes the set of variable nodes adjacent to the check node with index m, H(n) represents the set of check nodes adjacent to the variable node with index n, Card(.) denotes the cardinal of a set, where c=0 if $c_m$=+1 and c=$\delta_{max}$+1 if $c_m$=−1 where $\delta_{max}$ is the maximum degree of check nodes in the bipartite graph, and where $c_m$=+1/$c_m$=−1 mean that the parity check is/is not satisfied respectively for the check node with index m.

* * * * *

UNITED STATES PATENT AND TRADEMARK OFFICE
CERTIFICATE OF CORRECTION

PATENT NO. : 8,245,115 B2
APPLICATION NO. : 12/374531
DATED : August 14, 2012
INVENTOR(S) : Valentin Savin et al.

It is certified that error appears in the above-identified patent and that said Letters Patent is hereby corrected as shown below:

On the title page, under Other Publications, please insert therefor --MAO et al; "A New Schedule for Decoding Low-Density Parity-Check Codes", IEEE GLOBAL TELECOMMUNICATIONS CONFERENCE, Globecom 2001, Vol. 2 of 6 11-25-2001 pages 1007-1010--

Column 3 line 43, delete " $\tilde{a}_n$ " and insert therefor -- $\hat{a}_n$ --

Column 13 line 18, delete "$\alpha_{mn}$" and insert therefor --$\beta_{mn}$--

Column 14 line 33, delete the first " $\hat{a}_n$" and insert therefor -- $\tilde{a}_n$ --

Column 16 line 66, delete "($f_dn, f_dm$)" and insert therefor -- $(f_d(n), \tilde{f}_d(m))$ --

Column 17 line 14, delete "($f_dn, f_dm$)" and insert therefor -- $(f_d(n), \tilde{f}_d(m))$ --

Column 17 line 34, delete "($\alpha_n$)" and insert therefor -- $\hat{a}_n$ --

Column 17 line 39, delete "($\alpha_n$)" and insert therefor -- $\tilde{a}_n$ --

Column 18 line 6, delete "1, . . . , M" and insert therefor --{1, . . . , M}--

Column 18 line 7, delete "1, . . . , N" and insert therefor --{1, . . . , N}--

Column 18 line 25, delete "1, . . . , M" and insert therefor --{1, . . . , M}--

Column 18 line 26, delete "1, . . . , N" and insert therefor --{1, . . . , N}--

Signed and Sealed this
Nineteenth Day of March, 2013

Teresa Stanek Rea
*Acting Director of the United States Patent and Trademark Office*